(12) United States Patent
Dalmia et al.

(10) Patent No.: US 10,984,606 B1
(45) Date of Patent: Apr. 20, 2021

(54) GRAPHICAL USER INTERFACE TOOL FOR ORIENTING COMPUTER-AIDED DESIGN MODEL

(71) Applicant: Dassault Systemes SolidWorks Corporation, Waltham, MA (US)

(72) Inventors: Priya Dalmia, Lexington, MA (US); Amina M. Roderick, Brookline, NH (US)

(73) Assignee: DASSAULT SYSTEMES SOLIDWORKS CORPORATION, Waltham, MA (US)

( * ) Notice: Subject to any disclaimer, the term of this patent is extended or adjusted under 35 U.S.C. 154(b) by 0 days.

(21) Appl. No.: 16/014,922

(22) Filed: Jun. 21, 2018

(51) Int. Cl.
*G06T 19/20* (2011.01)
*G06F 3/0484* (2013.01)
*G06F 30/00* (2020.01)

(52) U.S. Cl.
CPC .......... *G06T 19/20* (2013.01); *G06F 3/04845* (2013.01); *G06F 30/00* (2020.01); *G06F 2203/04802* (2013.01); *G06F 2203/04806* (2013.01)

(58) Field of Classification Search
CPC ..... G06T 19/20; G06F 3/04845; G06F 17/50; G06F 2203/04802; G06F 2203/04806
See application file for complete search history.

(56) References Cited

U.S. PATENT DOCUMENTS

| | | | | |
|---|---|---|---|---|
| 7,353,192 B1* | 4/2008 | Ellis | ................... | G06Q 20/3829 |
| | | | | 705/26.5 |
| 2002/0171644 A1* | 11/2002 | Reshetov | ................ | G06T 17/20 |
| | | | | 345/420 |
| 2005/0028111 A1* | 2/2005 | Schrag | ................ | G06F 3/04815 |
| | | | | 715/851 |
| 2007/0107371 A1* | 5/2007 | Plocher | ................... | G06T 19/20 |
| | | | | 52/745.05 |
| 2008/0155468 A1* | 6/2008 | Rosander | .............. | G06F 19/321 |
| | | | | 715/810 |
| 2008/0238916 A1* | 10/2008 | Ghosh | ................. | G06F 3/04815 |
| | | | | 345/419 |

(Continued)

OTHER PUBLICATIONS

Endersby, S., "Kicking the Tires of SOLIDWORKS xDesign," Apr. 27, 2018. https://blogs.solidworks.com/solidworksblog/author/stephenendersby.

*Primary Examiner* — Mandrita Brahmachari
(74) *Attorney, Agent, or Firm* — Hamilton, Brook, Smith & Reynolds, P.C.

(57) ABSTRACT

A change in orientation or reorientation operation is applied to 3D models while maintaining constant zoom level of model display. The orientation is provided by a computer-based tool or GUI widget formed of a transparent container element and a miniaturized depiction of the 3D model. The transparent container element encapsulates the miniaturized depiction and enables see through view of the miniaturized depiction illustrating real time orientation of the 3D model. The container element is user-interactive to effect change in orientation of the 3D model concurrently displayed in a work area of a screen view. The zoom level of the displayed 3D model in the work area remains constant avoiding or omitting zoom to extents throughout user interaction with the GUI widget.

20 Claims, 13 Drawing Sheets
(10 of 13 Drawing Sheet(s) Filed in Color)

(56) References Cited

U.S. PATENT DOCUMENTS

| | | | |
|---|---|---|---|
| 2012/0032958 A1* | 2/2012 | Werline | G06T 19/20 345/420 |
| 2012/0326994 A1* | 12/2012 | Miyazawa | G06F 3/0346 345/173 |
| 2013/0047121 A1* | 2/2013 | Kao | G06F 9/44505 715/810 |
| 2014/0078102 A1* | 3/2014 | Araki | G06F 3/016 345/174 |
| 2018/0053130 A1* | 2/2018 | Pettersson | G06Q 10/06311 |
| 2018/0218540 A1* | 8/2018 | Sridharan | G06T 19/006 |
| 2018/0260503 A1* | 9/2018 | Dweik | G06F 17/5009 |
| 2019/0066408 A1* | 2/2019 | Vijayan | G06F 3/04842 |

* cited by examiner

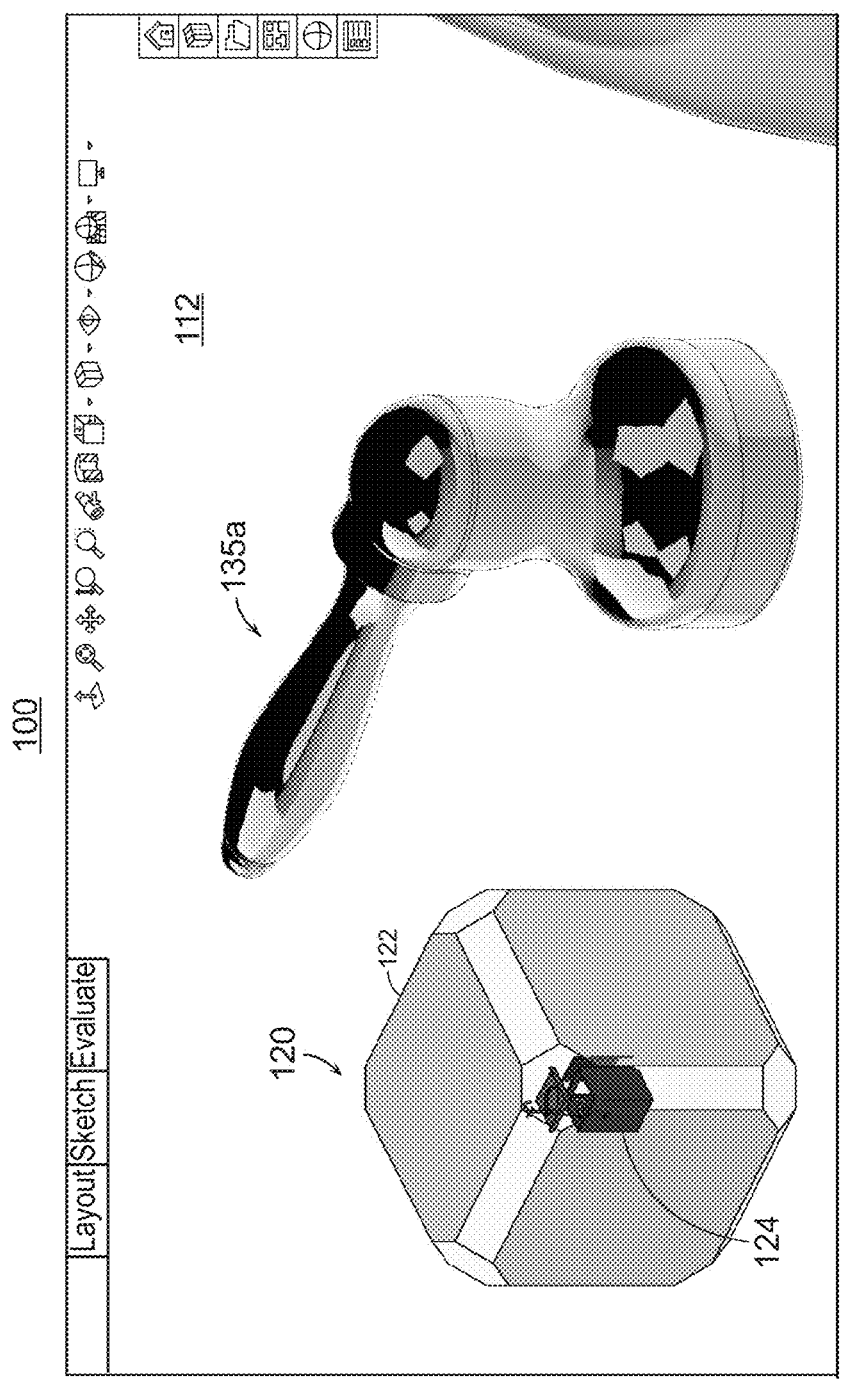
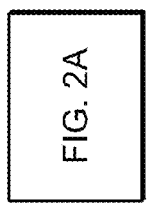 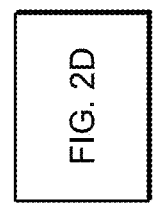
FIG. 1E
FIG. 2

GRAPHICAL USER INTERFACE TOOL FOR ORIENTING COMPUTER-AIDED DESIGN MODEL

BACKGROUND

Computer-aided design (CAD) software allows a user to construct and manipulate complex three-dimensional (3D) models. A number of different modeling techniques can be used to create a 3D model. These techniques include solid modeling, wire-frame modeling, and surface modeling. Solid modeling techniques provide for topological 3D models, where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these and other modeling techniques, such as parametric modeling techniques. Parametric modeling techniques can be used to define various parameters for different features and components of a model, and to define relationships between those features and components based on relationships between the various parameters.

CAD systems may also support two-dimensional (2D) objects that are 2D representations of 3D objects. Two- and three-dimensional objects are useful during different stages of a design process. Three-dimensional representations of a model are commonly used to visualize a model in a physical context because the designer can manipulate the model in 3D space and can visualize the model from any conceivable viewpoint. Two-dimensional representations of a model are commonly used to prepare and formally document the design of a model.

A design engineer is a typical user of a 3D CAD system. The design engineer designs physical and aesthetic aspects of 3D models, and is skilled in 3D modeling techniques. A 3D model is formed of a hierarchy of assemblies, subassemblies, and parts. The design engineer creates parts and may assemble the parts into a subassembly. A subassembly may also consist of other subassemblies. An assembly is designed using parts and subassemblies. Parts and subassemblies are at times herein referred to as components.

The position of a part (its location and orientation) in the 3D model dictates angles of view and access of the part for a user of the CAD system. For example, a part that is embedded in a subassembly on the bottom side of the 3D model is viewed and accessed by a design engineer or other user as follows. Beginning with a screen view showing the totality of the 3D model (i.e., the view of the 3D model is at a zoom level such that outer extents of the model are simultaneously visible without the need to scroll the screen), the user orients the model to expose and show the bottom surface. The user navigates the cursor through the bottom surface side of the assembly that comprises the subject subassembly and zooms in to the subassembly (changes zoom level of the view of the 3D model). As part of the navigation, the user rotates or otherwise changes orientation of the 3D model. The user continues to navigate through the subject subassembly and eventually to the part of interest using a combination of changing orientation of the model and changing zoom level.

In some instances, the state-of-the-art zoom function does not hold zoom level stable with respect to certain model operations such as changing orientation of the 3D model. Consequently, each time the user rotates (i.e. applies a change in orientation operation to) the 3D model, the CAD system removes the existing (current) zoom level of the display view of the 3D model. Some CAD systems perform a 'zoom to extents' of the 3D model initializing the model for applying the change in model orientation operation. After changing the 3D model to the user-specified orientation, the operation ends with the 3D model newly oriented and displayed at a neutral or default zoom level different from the initial zoom level used before user application of the change in model orientation operation. Thus the resulting display view of the 3D model is relatively changed in zoom level (e.g., zoomed out) from the view of the model before changing model orientation. This unrequested change in zoom level is very disorienting to the user and disrupts the user's progress toward viewing and accessing the subject part. Consequently, in each iteration of orient and zoom-in, the user must re-navigate a portion of the 3D model in order to regain the view of the model at the zoom level used immediately prior to applying the change in model orientation operation. So the fairly straightforward task of iteratively orienting and zooming-in to progressively navigate to the subject part becomes labor-intensive and inefficient with constant intermediate recovery of zoom level as a side effect of the change in model orientation operation.

SUMMARY

Embodiments of the present invention address the foregoing shortcomings and disadvantages of the art. In particular, the present invention provides a computer-based tool, a graphical user interface (GUI), a widget, and the like for changing orientation (re-orienting, rotating and the like) of a 3D model while maintaining current zoom level of the display view. Moreover, embodiments avoid the need to perform a 'zoom to extents' when applying a change in model orientation operation to a 3D model. In embodiments, a CAD system, a computer-implemented method, and/or computer apparatus selectively change model orientation on user command without (i.e. free of) altering, reverting, disrupting, or otherwise affecting current zoom level of the display view of the 3D model. In this way, embodiments avoid or minimize the need for a user to subsequently adjust/readjust zoom level as a consequence of applying the change in orientation operation to a 3D model as heretofore un-achieved by the prior art.

In one embodiment, a graphical user interface (GUI) to a computer-generated 3D model comprises: a miniaturized depiction of the 3D model encapsulated in a container element. The 3D model is separately displayed from the miniaturized depiction in a work area, and the 3D model is rendered in the work area based on user input and manipulation including a zoom level. The container element encapsulating the miniaturized depiction, has transparent sides such that the encapsulated miniaturized depiction is viewable through the sides of the container element and illustrates a current orientation of the 3D model in the work area. The transparent container element is user interactive to effect orientation of the 3D model as displayed in the work area. In response to user interaction changing orientation of the container element, a computer processor similarly and simultaneously changes orientation of the 3D model in the work area while maintaining the zoom level (and omitting any 'zoom to extents') of the 3D model as displayed in the work area.

Restated, the computer processor responsively changes orientation of the 3D model in the work area in a same direction and extent as the user interaction changes orientation of the container element. Further, the computer processor changes orientation of the 3D model in the work area synchronously or substantially simultaneously with user interaction changing orientation of the container element as if the user interaction was directly on the 3D model in the work area. Meanwhile, throughout the user interaction with the GUI (changing orientation of the container element and processor response equivalently changing orientation of the 3D model in the work area), the zoom level of the display of the 3D model in the work area is unchanged, i.e. maintained constant and left undisturbed. No 'zoom to extents' is performed during operation or application of the GUI.

For non-limiting example, where the user interaction rotates the container element in a certain direction with respect to a coordinate system in three-dimensional space, the computer processer rotates, at the current zoom level, the 3D model in the work area in a same direction as the certain direction of the container element. At the same time, the computer processor maintains zoom level of the display of the 3D model in the work area and in particular does not perform a 'zoom to extents' of the 3D model.

The container element may have indicia of the axes of the three-dimensional space coordinate system. In one embodiment, the coordinate system is the Cartesian coordinate system. The container element has a first side shaded red to indicate the x-axis. A second side of the container element is shaded green to indicate the y-axis. A third side of the container element is shaded blue to indicate the z-axis.

In another embodiment, the indicia of axes of a coordinate system includes a triad.

In embodiments of the graphical user interface, the user interaction rotates the container element according to measured units or pre-defined increments, such as degrees, radians, and other units.

The shape of the container element may be based on a cube, a sphere, or other volumetric space.

The 3D model may be a CAD system model, a solid model, or other similar computer-generated model.

The forgoing functions and features may be implemented or embodied by a computer system (e.g., a CAD system), a computer program product, a computer-implemented method, a computer-based apparatus, and the like.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIGS. 1A-1E are schematic views of graphical user interfaces in a CAD modeling system embodying the present invention.

DETAILED DESCRIPTION

A description of example embodiments follows.

Embodiments of the present invention provide mechanisms for user-interactively effecting, controlling or otherwise defining orientation of the 3D model while maintaining current zoom level (and omitting performance of 'zoom to extents') of the display of the model. The mechanism may take the form of a computer-based tool, a widget, a graphical user interface (GUI) and the like employed in a CAD or other computer-based 3D modeling system. Other forms (for nonlimiting example, computer implemented method, system, program product, and apparatus) are suitable. Other 3D modeling or computer-generated model handling environments and various engineering design environments are appropriate. Embodiments advantageously enable a user to efficiently navigate and/or manipulate the 3D model as heretofore un-achieved by the prior art.

Figure 1A:
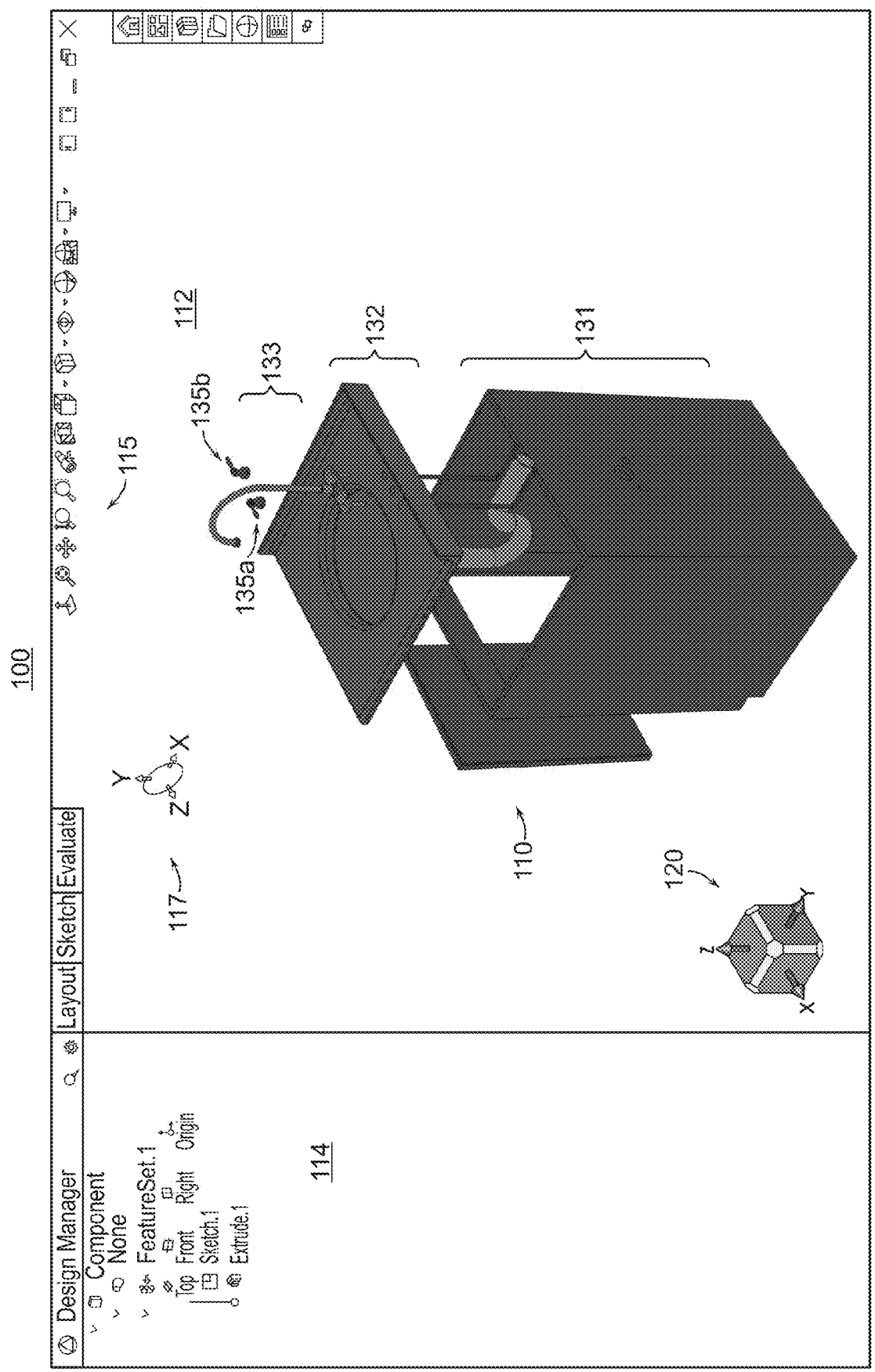

FIGS. 1A through 1E illustrate a Computer-Aided Design (CAD) system, Computer-Aided Engineering System, or other computer-based 3D modeling system embodying the present invention. For ease of description, the embodying system is herein referred to as CAD system 100, but it is understood that other systems employing computer-generated 3D models are suitable. In FIG. 1A, CAD system 100 generates and supports 3D model 110 in work area 112. FIG. 1A shows the 3D model 110 at an initial or default zoom level where the user can at a single glance see the outer extents of the model (the whole model) without the need to scroll or pan the screen view.

The user interface (GUI) includes various tools 115 for manipulating the 3D model 110, for navigating about the model 110, and for further designing (composing) the model 110. The tools 115 may be implemented as menu options, user selectable buttons or activation areas, other user interactive commands, and/or I/O events (e.g. cursor control device selections, mouse left click/right click, touchscreen tap/double tap, etc.). Implementations may include other window areas, such as a list of features 114, which helps the user visualize and manipulate the model 110 in the work area 112. At times the graphical user interface also provides visual aids that give context or reference for a tool's 115 operations or view of model components in work area 112 as well be made clear below. A system triad 117 in the GUI displays indications of the X, Y, Z axes and origin of a coordinate system in 3D space of CAD system 100. Other coordinate systems instead of or in addition to the Cartesian coordinate system are suitable. The CAD system 100 defines and stores the coordinate system parameters (origin, and x, y, and z axes) in memory as metadata to the model 110.

More specifically, in general, a starting surface serves as an initial work plane for composing and constructing a model, such as 3D model 110, in work area 112. CAD system 100 associates with the starting surface an origin and orthogonal axes, such as x, y, and z axes, of the system's three-dimensional space coordinate system. CAD system 100 stores this information in the form of definitions and coordinate system parameters for the three-dimensional space aspects of work area 112.

With reference to FIG. 1A, the shown 3D model 110 represents a vanity assembly of the real-world. The vanity assembly is shown in exploded view having:
  i. a vanity box-shaped stand and door as a base unit 131 (or one subassembly of the 3D model 110);
  ii. a sink bowl subassembly 132; and
  iii. a faucet fixture subassembly 133.

The base unit (vanity subassembly) 131 supports or houses the sink bowl subassembly 132 and faucet fixture subassembly 133. The sink bowl subassembly 132 is seated in the top side of the base unit 131, and includes three component parts, namely, an upper planar surface, a bowl, and the drainpipe. The faucet fixture subassembly 133 has as parts two handles 135A, 135B and a spout which are seated in respective openings of the upper planar surface of the sink bowl subassembly 132.

In composing or authoring the 3D model 110 in work area 112, CAD system 100 effectively uses as the starting surface the bottom side of the base unit 131. The starting surface and thus the bottom side of base unit 131 lies in the x-y plane with the x-axis being horizontal (i.e. left-right) across the front face of the base unit 131 and the y-axis being in and out of the front facing view (normal to the front and back sides or faces of the base unit 131). In turn, CAD system 100 defines the front facing orientation of 3D model 110 (the front side or face of the vanity assembly) to be in the x-z plane of the coordinate system with the coordinate system origin at the bottom front left corner of the base unit 131. In this way, CAD system 100 (a) sets the definitions of the coordinate system axes and origin for system triad 117 with respect to work area 112, and (b) defines and stores as model metadata the coordinate system parameters (origin and orthogonal axes) for 3D model 110. A system level data structure 94 (FIG. 5) may store the coordinate system definition settings for system triad 117. Separate and distinct from the system triad 117, there is a container triad 120 in the GUI of FIGS. 1A through 1E. Container triad 120 utilizes the coordinate system axes and origin defined for system triad 117. For example, container triad 120 may access the data structures storing the coordinate system definition settings. In embodiments, container triad 120 is generally cubed shaped but other volumetric shapes (e.g. a sphere) are suitable. For ease of description and nonlimiting example, shape of the container triad 120 of FIGS. 1A through 1E will generally be referenced herein as a six-sided cube.

In embodiments, container triad 120 operates in two modes both of which provide indications of current orientation of 3D model 110 in work area 112. These two modes of operation are referred to herein as "indicator mode" of container triad 120 and "manipulation mode" of container triad 120. In indicator mode, container triad 120 indicates in terms of xyz coordinates of the current orientation of the 3D model 110 in work area 112. The xyz coordinates are from the three-dimensional space coordinate system of CAD system 100 described above. In manipulation mode, the container triad 120 provides a user interactive mechanism to change orientation of (re-orient, rotate, and the like) the 3D model 110 in work area 112. In embodiments, throughout the two modes of operation, container triad 120 may employ color coding. Red shading or color of a side of the cube shape symbolizes the x axis. Green color or shading of cube sides symbolizes the y axis, and blue color or shading of cube sides symbolizes the z axis. Respective color-coded arrows or arrowheads may be used to indicate positive x, y, z axes.

FIG. 2 (or FIGS. 2A-2D collectively) present a table summarizing display of container triad 120 in indicator mode (Mode 1) and counterpart manipulation mode (Mode 2) for respective views (front, side, back, etc.) and thus orientation of the 3D model 110 in work area 112 in one embodiment. In the first row in FIG. 2A, the table shows the container triad 120 in indicator mode has the X-axis laying horizontally left-right and the Y-axis in and out of the page. The Z-axis is vertically up and down. In these xyz terms, container triad 120 indicates the 3D model 110 is currently front facing (square in the x-z plane in work area 112). In the counterpart or corresponding manipulation mode (in the middle of the first row), the container triad 120 is illustrated with the y-axis cube face in the x-z plane (i.e. the y-axis extends normal to the cube face). Here container triad 120 also pictorially illustrates or depicts (in miniaturized model fashion) in cooperation with the cube, current orientation of 3D model 110 to be front facing. The right-hand end of the first row shows that the 3D model 110 as displayed in work area 112 is in a front view orientation.

Figure 2A:
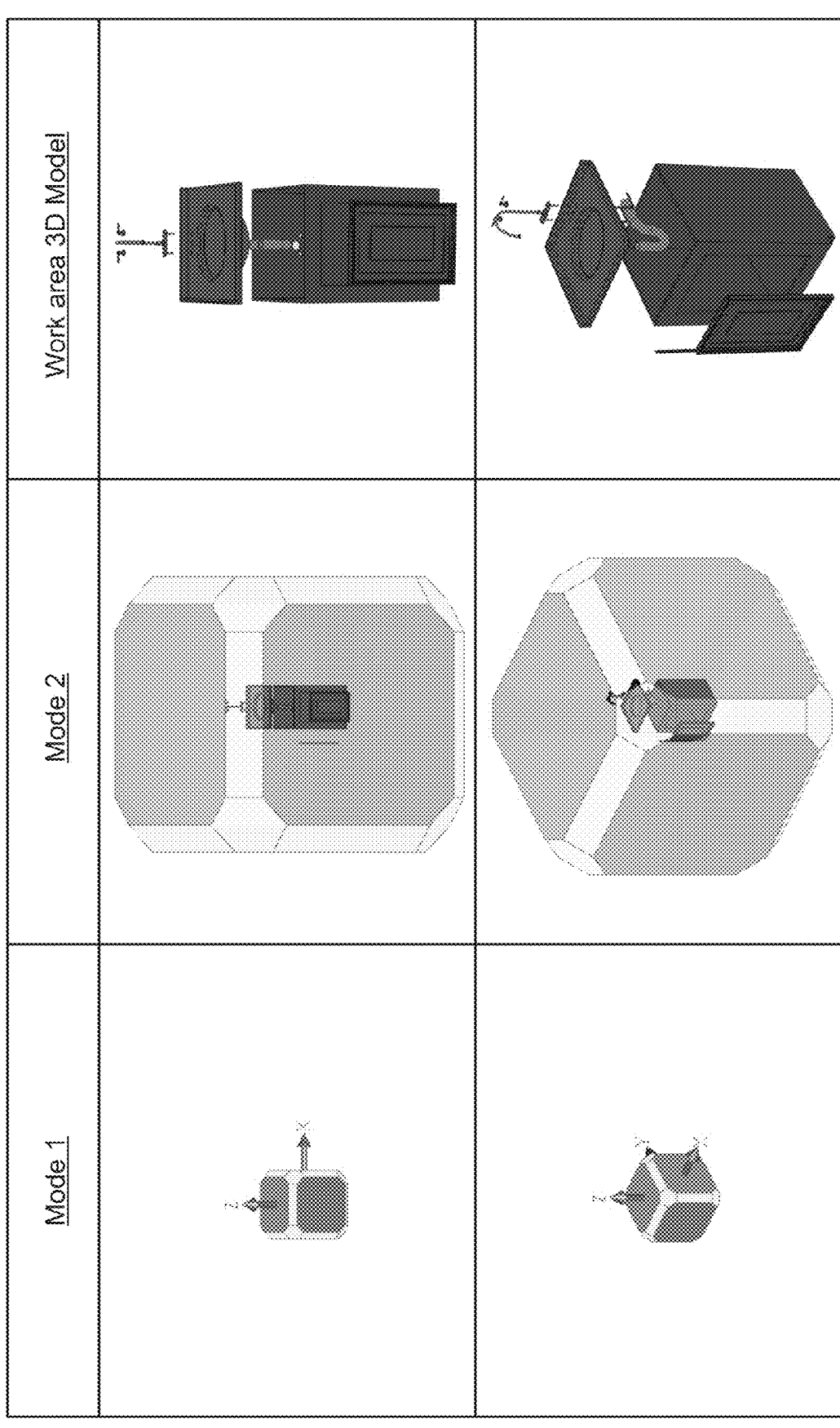
FIGS. 2A-2D in series (generally FIG. 2) illustrate a table showing example modes of operation of an embodiment.

The second row in the table in FIG. 2A shows the container triad 120 in indicator mode (Mode 1) and counterpart manipulation mode (Mode 2) corresponding to the 3D model 110 rotated 45° clockwise about the z-axis from the front view orientation of the first row. In particular, the xyz coordinates of the indicator mode (left-hand end of the second row) are shown rotated 45° clockwise about the z-axis from the xyz coordinates of the first row. Similarly, the miniaturized pictorial illustration of the model encapsulated inside of the cube and the cube itself of the manipulation mode (middle of the second row) are shown rotated 45° clockwise about the z-axis relative to that of the first row. The right-hand end of the second row shows that the 3D model 110 in work area 112 is currently in a front-right view orientation (i.e. with the normal to the front side of the 3D model pointing about 45° to the foreground of the leftward horizontal, and the normal to the right side of the 3D model pointing about 45° to the foreground of the rightward horizontal).

Figure 2B:
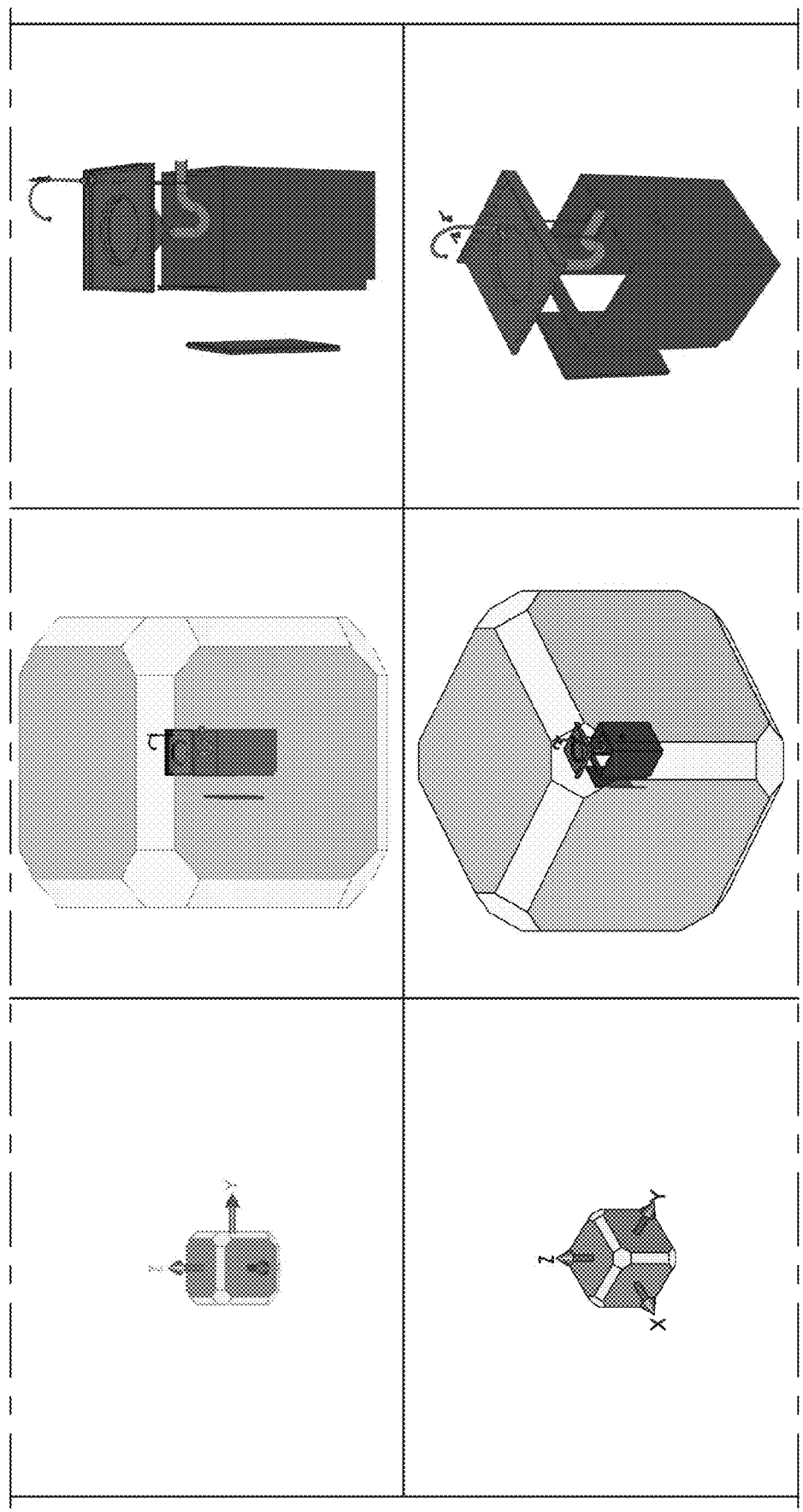
Figure 2C:
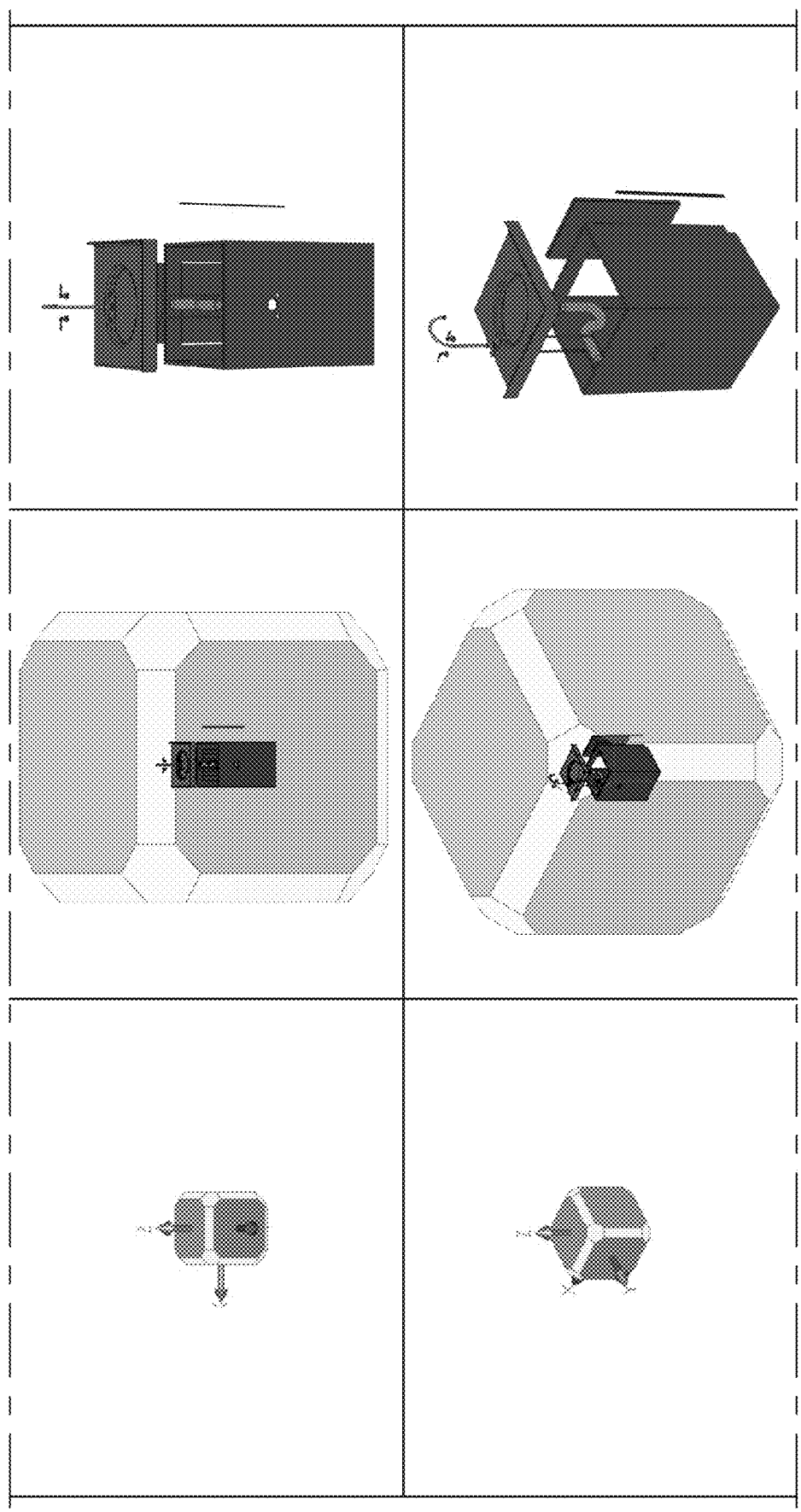
Figure 2D:
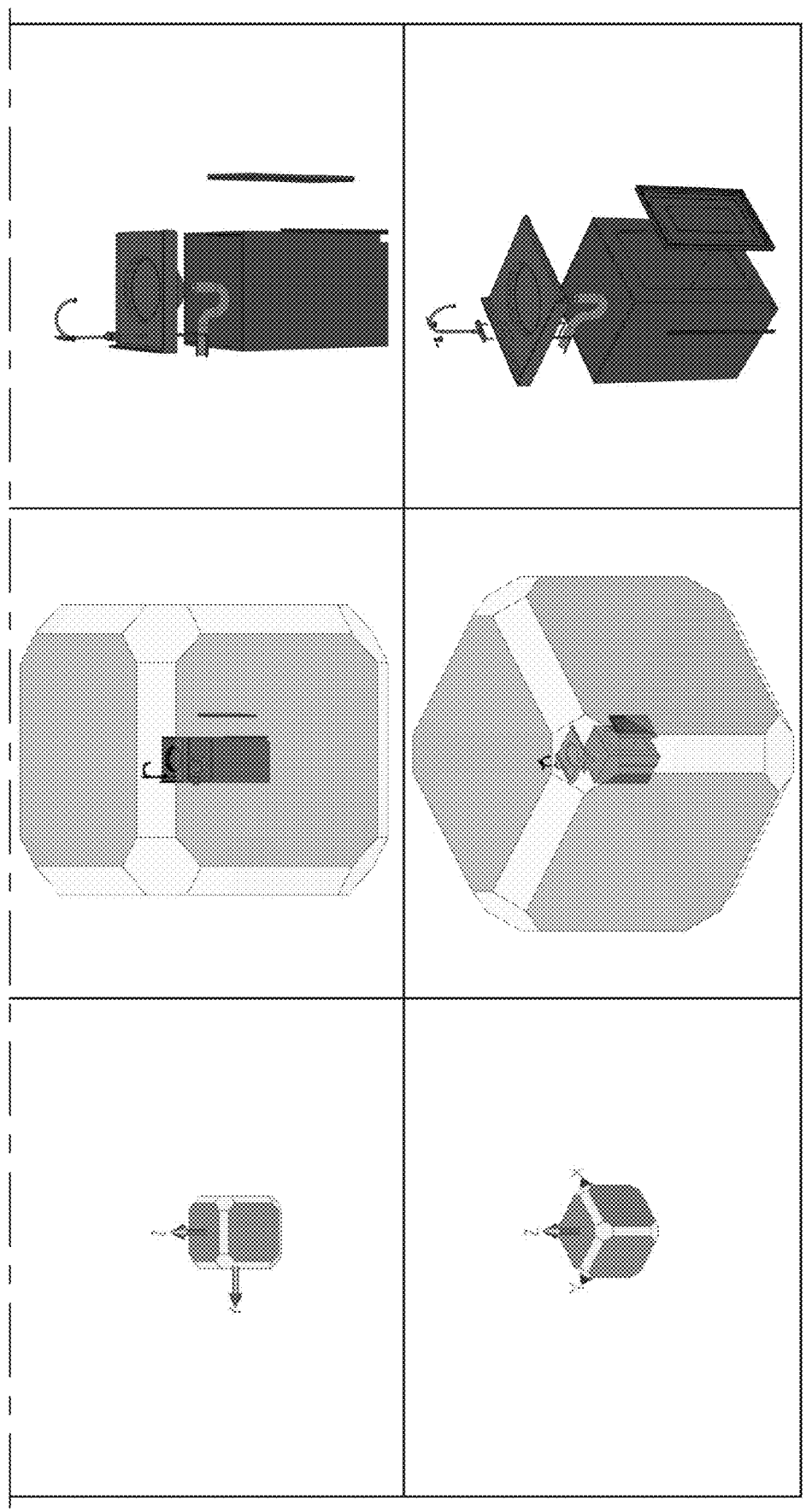

And so on for the third and succeeding rows of the table of FIGS. 2A-2D. That is, the table rows of FIG. 2B show the container triad (in Modes 1 and 2) and corresponding 3D model rotated 90° and 135°, respectively, clockwise about the z-axis from the front view of the model. The table rows of FIG. 2C show the container triad (in Modes 1 and 2) and corresponding 3D model rotated 180° and 225°, respectively, clockwise about the z-axis from the front view of the model. The table rows of FIG. 2D show the container triad (in Modes 1 and 2) and corresponding 3D model rotated 270° and 315°, respectively, clockwise about the z-axis from the front view of the model. Thus, each row of the FIG. 2 table shows respective: (a) indicator mode xyz coordinates of container triad 120, (b) counterpart or corresponding manipulation mode (with transparent cube and encapsulated miniaturized model illustration) of container triad 120, and (c) corresponding 3D model orientation in the work area 112, each rotated about 45° clockwise about the z-axis from the immediate prior row.

In operation in the non-limiting example of FIG. 1A, container triad 120 is displayed in indicator mode and has a red X-axis arrow extending from a red shaded side of the cube shape and pointing about 45° to the foreground of the leftward horizontal. Container triad 120 shows the green Y-axis arrow extending from a green shaded side and pointing about 45° to the foreground of the rightward horizontal. The blue Z-axis arrow points vertically up and extends from a blue shaded top side of the cube shape.

Container triad 120 thus symbolizes or graphically indicates in xyz coordinates that the 3D model 110 in work area 112 is rotated clockwise about the Z-axis about 135° from the front view orientation. This means that the vanity assembly/3D model 110 is oriented with the back-right corner of base unit 131 centered in the foreground as illustrated in the work area 112 of FIG. 1A.

Figure 1B:
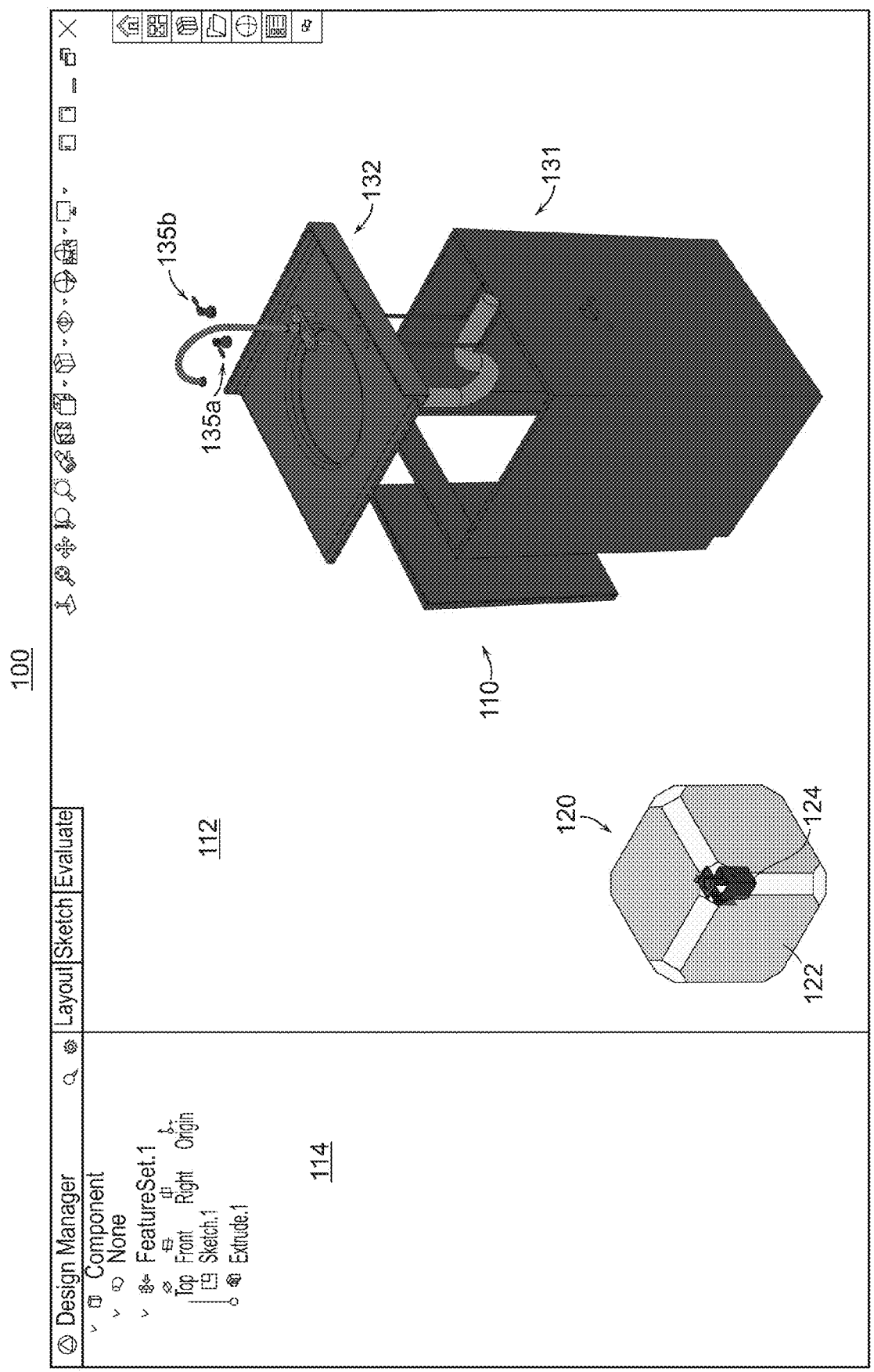
Figure 1C:
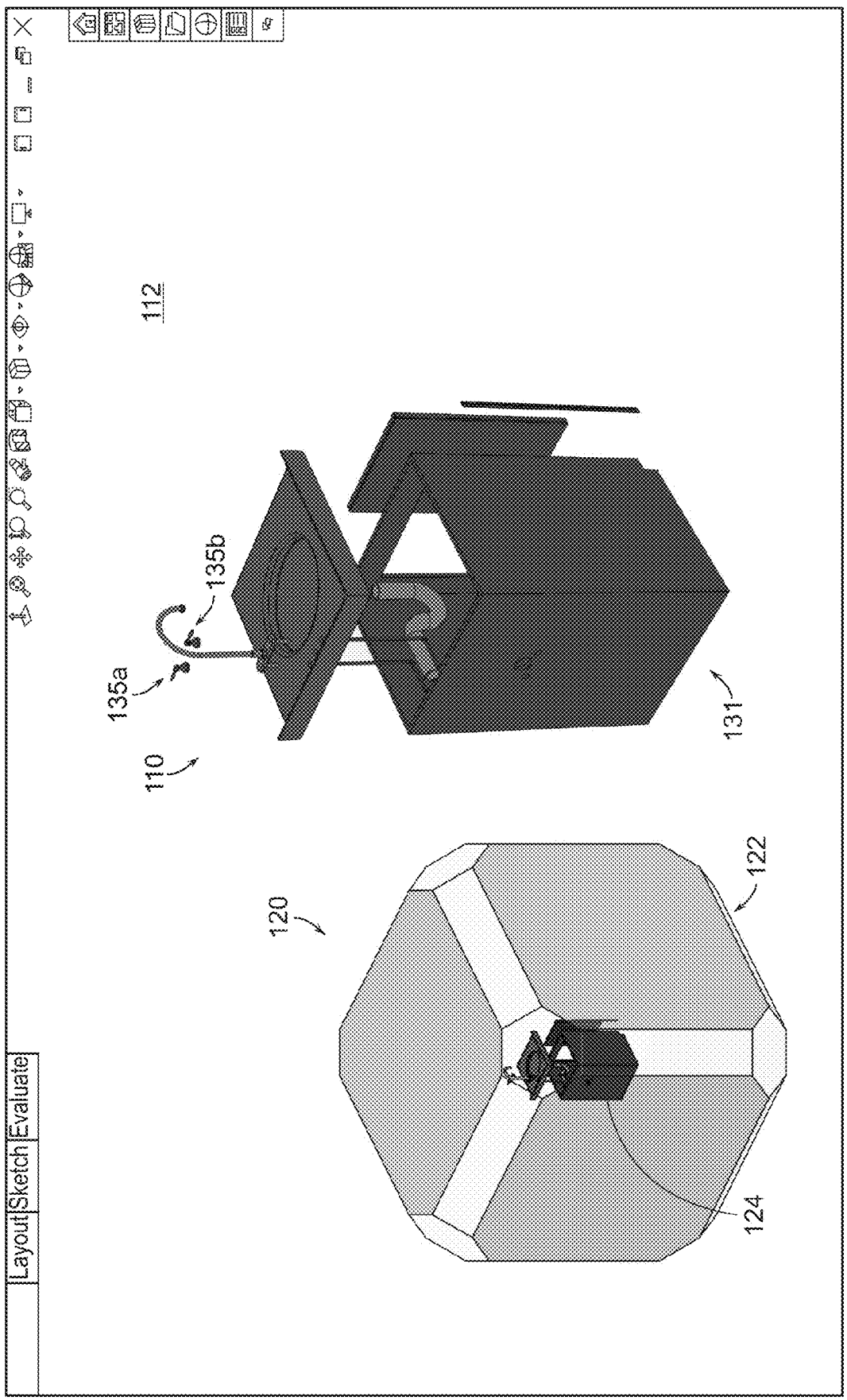

In one embodiment, to switch from indicator mode to manipulation mode, the user hovers the cursor (or pointer) over displayed container triad 120, or using touchscreen technology taps the container triad 120. In manipulation mode as illustrated in FIGS. 1B, 1C and 1E, container triad 120 is formed of a transparent container element 122 and a miniaturized depiction 124 of 3D model 110 as currently oriented in work area 112. The container element 122 shown here is cube shaped but may be of any volume containing shape in other embodiments. The sides (faces) of the container element 122 are displayed color coded with the sides having x-axis normal thereto being shaded red, the sides having y-axis normal thereto being shaded green, and the sides having z-axis normal thereto being shaded blue.

The container element 122 encapsulates the miniaturized depiction 124. The sides of displayed container element 122 (or faces of the cube shape) are transparent and allow users to view the encapsulated miniaturized depiction 124 through the sides of the container element 122. More importantly, the transparent container element 122 encapsulating the miniaturized depiction 124 illustrates at a glance, current orientation of the 3D model 110 in work area 112. With ease and efficiency, a user is able to gain an understanding of the orientation of the overall 3D model 110 in work area 112 by viewing the displayed container triad 120 in manipulation mode as illustrated in FIGS. 1B, 1C, and 1E.

In embodiments, to toggle back to indicator mode (FIG. 1A) from manipulation mode (FIG. 1B) of the container triad 120, the user selects (via cursor control device events, mouse click, or in touch screen technology taps, etc.) outside of the displayed container element 122. Also, if there is no user interaction with the displayed container element 122/container triad 120 in manipulation mode for a threshold amount of time (for non-limiting example 2 seconds in one embodiment), then CAD system 100 dismisses container element 122 and the encapsulated miniaturized depiction 124, and restores the container triad to indicator mode in the screen view.

Say in FIG. 1B the user wishes to change orientation (i.e. rotate) the 3D model 110 in work area 112. The displayed container triad 120 in manipulation mode provides an interactive tool for the user to efficiently apply the change in orientation operation to 3D model 110 while maintaining current zoom level of the display of the model 110 in work area 112. In one embodiment, the user interacts with the displayed container element 122 to manipulate and rotate container triad 120. Specifically, the user selects a side of the displayed container element 122 by a cursor control device command (such as a mouse click) or in touch screen technology by a tap. In response, CAD system 100 rotates container triad 120 so that the selected side is brought to the foreground. CAD system 100 synchronously and similarly (equivalently) rotates 3D model 110 as displayed in work area 112 at the current zoom level as if the user was directly interacting with (changing orientation of) the model 110 there. CAD system 100 does not 'zoom to extents' during this application of the change in model orientation operation to 3D model 110.

In this context, 'zoom to extents' is a CAD model normalizing step of sorts in the art. A CAD system or processor finds the origin of the 3D coordinate system as applied to the subject 3D model by zooming to extents from the current view display. Embodiments of the present invention omit performing and rendering of 'zoom to extents' which disrupts and distracts end-users, and instead embodiments store coordinate system origin and axes parameters in a system level data structure that is associated with container triad 120. Association may be via system triad 117 sharing definition data and working methods with container triad 120.

In the illustrated example, if the user selects the green shaded positive y-axis side of container element 122 in FIG. 1B, then CAD system 100 rotates the container element 122 and synchronously rotates 3D model 110 in the work area 112 clockwise 90° about the z-axis bringing the backside of the model through the foreground while maintaining current zoom level. CAD system 100 need not 'zoom to extents' to find the coordinate system origin of 3D model 110/work area 112. Instead, CAD system 100 utilizes the coordinate system origin and axes parameters stored as model metadata in system level data structure 94 (FIG. 5) as described above. This results in vanity assembly/3D model 110 being oriented with the back-left corner of base unit 131 centered in the foreground as illustrated in the work area 112 of FIG. 1C. Next CAD systems 100 takes a screen shot image of 3D model 110 having been so rotated in work area 112, and sizes the screen shot image to fill container element 122. CAD system 100 refreshes display of container triad 120 in manipulation mode using the screen shot image of 3D model 110 as newly rotated and a synchronously rotated container element 122 (now at 225° rotated clockwise about the z-axis from the front view orientation) encapsulating the sized image. The container triad 120 of FIG. 1C is illustrative.

Figure 1D:
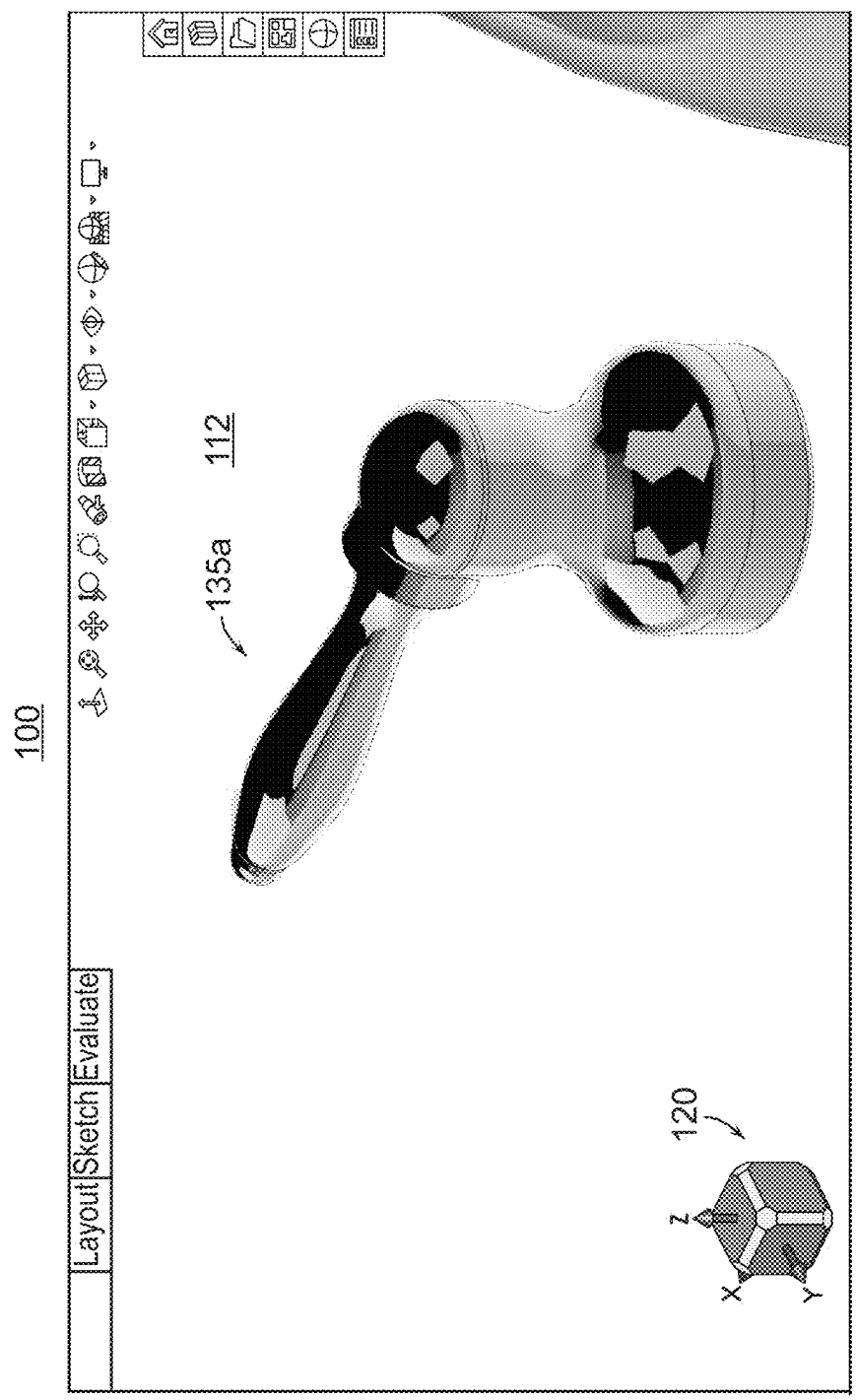

After completion of the change in model orientation operation of FIGS. 1B and 1C, the container triad 120 resumes its indicator mode as illustrated in the lower part of FIG. 1D. The xyz coordinates of the displayed container triad 120 correspond to the now current orientation of 3D model 110 in work area 112. In the example, say the user having oriented the 3D model 110 in work area 112 next zooms in to handle part 135A of the vanity assembly/3D model 110. FIG. 1D shows such a zoomed in view of 3D model 110 in work area 112. The extent of the zoom level is such that CAD system 100 displays a close-up of right-hand side handle 135A of the vanity assembly (3D model 110). At this zoom level, it is difficult for a user to readily decipher orientation of the whole 3D model 110/vanity assembly in work area 112. The container triad 120 being in indicator mode represents in xyz coordinates that the current orientation of 3D model 110 is rotated clockwise about the z-axis 225° from the front view orientation. A user may be unable to easily mentally translate or visualize this represented rotation/orientation of the 3D model 110. With the tap of a touchscreen or hovering of the cursor on the container triad 120 in FIG. 1D, CAD system 100 toggles the container triad 120 to manipulation mode as illustrated in FIG. 1E. In manipulation mode, container triad 120 displays a miniaturized depiction 124 of 3D model 110 as currently oriented in work area 112. Container element 122 with transparent sides encapsulates the miniaturized depiction 124. At 225° clockwise rotation about the z-axis, the vanity assembly (3D model 110) has the back and left sides of the base unit 131 in the foreground at 45° angles from center.

The color-coded shading of the transparent container element 122 sides further illustrates current orientation of the 3D model 110/vanity assembly. The front left side of container element 122 is shaded green symbolizing the y-axis direction. The front right side of container element 122 is shaded red symbolizing the x-axis direction. The container element 122 top side is shaded blue symbolizing the z-axis direction (vertically up and down). The color-coded, shaded transparent sides of container element 122 corresponds in color and position with the xyz coordinate indications of container triad 120 in indicator mode of FIG. 1D.

As detailed above with reference to FIGS. 1B and 1C, in manipulation mode, the user can interactively operate container triad 120 to effect rotation of the 3D model 110 as displayed in work area 112 without disturbing current zoom level of the display view (and without an intervening 'zoom to extents'). The same applies to FIG. 1E. With a zoomed in display view of 3D model 110 in work area 112, the container triad 120 in manipulation mode enables the user to interactively change model orientation with ease. More specifically, the user can with ease visualize the orientation of the whole 3D model 110 by utilizing the miniaturized depiction 124 (and present orientation of the container element 122) of the manipulation mode of the container triad 120 is illustrated in FIG. 1E. Likewise, as the user interactively rotates the container element 122 and the CAD system 100 responsively substantially simultaneously changes orientation of the 3D model 110 while maintaining current zoom level in the work area 112, the user can witness the effects of his applying the change in model orientation operation. Because CAD system 100 maintains constant (stable) or undisturbed current zoom level throughout the change in model orientation operation, the sequence of screen views displayed to the user appear steady with smooth and user-controlled transitioning in contrast to the sequence of screen views of the prior art with disruptive, intermediate, unrequested, zoomed in/zoomed out views or intervening 'zoom to extents' views. Each time the user selects a same side of the container element 122, CAD system 100 incrementally rotates the container element 122 together with the 3D model 110 in the direction associated with the user selected side (that is, the corresponding coordinate axis normal to the user selected side incrementally points toward and sweeps through the foreground of the display view).

In some embodiments, the incremental rotation is in predefined structured units such as 45° or 90°, etc. at a time. This may be implemented as a system default setting. In other embodiments, the user interaction with container element 122 generates a free rotation or random (user selectable) rotation amount in the direction associated with the user selected cube side. In another embodiment shown in FIGS. 6A through 6C, user selection of a button 160, menu option, or similar user command provides measured units or a scale 168 for defining amount of rotation in the change in model orientation command. With the container triad 120 in manipulation mode (FIG. 6A), in response to user selection via mouse click, touchscreen tap, etc. of button 160, CAD system 100 adds xyz axis triad arrows to the displayed container element 122 as shown in FIG. 6B. In particular, CAD system 100 displays a blue arrow 164 emanating normal to the z-axis face or side of container element 122, a red arrow 162 emanating normal to the x-axis side of container element 122, and a green arrow 166 emanating normal to the y-axis side of container element 122. Next the user may hover the cursor over one of the displayed, color coded triad arrows 162, 164, 166, thus effectively selecting the associated axis. CAD system 100 in response displays a scale 168 with measured units for rotation of the selected axis about an orthogonal axis as shown in the non-limiting example of FIG. 6C. In the example, the user placed and hovered the cursor over the x-axis red arrow 162 in FIG. 6B, and in response, CAD system 100 rendered scale 168 corresponding to the rotational path of the x-axis (for rotating container element 122 clockwise in measured units about the z-axis) as shown in FIG. 6C. The user may select (via cursor control device event, mouse click, or finger tap, etc.) outside of container element 122 to dismiss CAD system 100 display of scale 168. The scale 168 corresponding to the user-selected axis is user interactive by touchscreen technology (finger drag) or cursor control device event (e.g. left mouse button down and move cursor). Upon the user interaction dragging the displayed scale 168 a user selected amount, CAD system 100 rotates container element 122 and hence 3D model 110 in that amount in the direction associated with the corresponding user-selected axis. In one embodiment, the scale 168 operates in increments of 5° and utilizes operative code of the scale of system triad 117.

Figure 3:
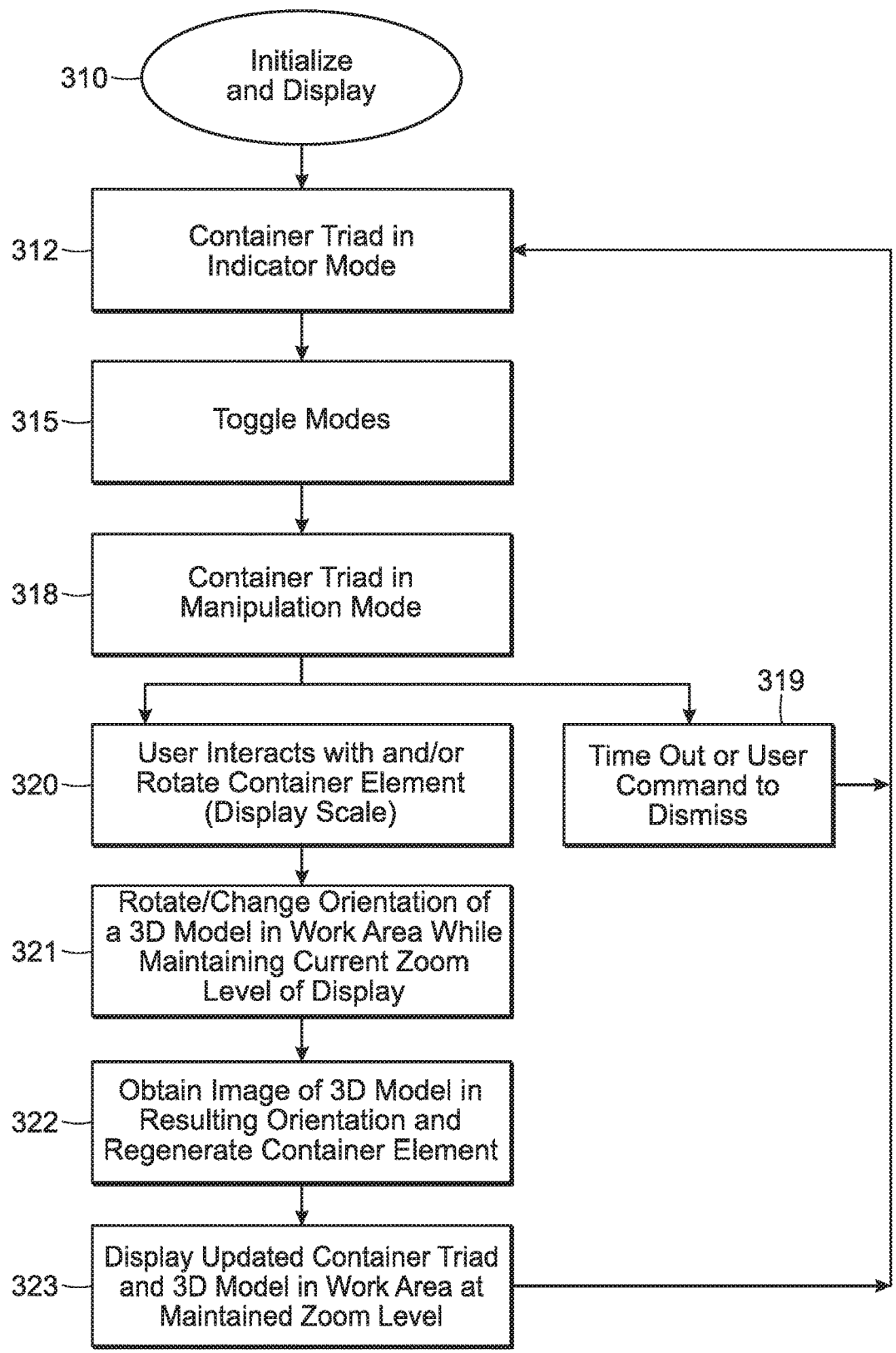
FIG. 3 is a flow diagram of an embodiment.

Turning to FIG. 3 a flow diagram of the change in model orientation operation 300 of embodiments of the present invention is provided. The operation 300 begins with CAD system 100 initializing the container triad 120 at 310. Specifically, CAD system 100/step 310 utilizes the coordinate system origin and xyz axes defined for the system triad 117 as the origin and coordinate system axes for the container triad 120. Next the initialization step 310 displays the container triad 120 in the work area 112 along with the subject 3D model 110.

In the initial display, CAD system 100/operation 300 provides the container triad 120 in indicator mode at step 312. In particular, step 312 displays the xyz arrowheads of container triad 120 in a manner that indicates three-dimensional space orientation (in terms of the xyz axes) of 3D model 110 in work area 112. Next, the CAD system 100 may detect user interaction with container triad 120 as displayed at 312. If the user hovers the cursor (or pointer) over the displayed container triad 120 or using touchscreen technology taps the container triad 120, then CAD system 100/step 315 responds and toggles the container triad 120 from indicator mode to manipulation mode. In turn, at step 318, the CAD system 100 displays the container triad 120 in manipulation mode that corresponds to the last displayed indicator mode (of step 312) as previously detailed in FIGS. 1B, 1C, 1E and FIG. 2. That is, operation 300/step 318 displays the container triad 120 formed of a container element 122 having transparent sides enclosing or encapsulating the miniaturized depiction 124 of the 3D model 110 as currently oriented in the work area 112.

At step 319, the CAD system 100/operation 300 may detect a user command to dismiss the container triad 120 as currently displayed in manipulation mode and return to indicator mode 312. At a threshold amount of time of inactivity by the user, step 319 will timeout and return display of the container triad 120 to indicator mode (at step 312). Upon detecting user interaction with the container triad 120 in manipulation mode, step 320 responds by changing orientation of the 3D model 110 in work area 112 as the user rotates the displayed container element 122 of step 318. Step 320 uses known or common techniques for showing animation of the container element 122 during user interaction therewith.

Figure 6A:
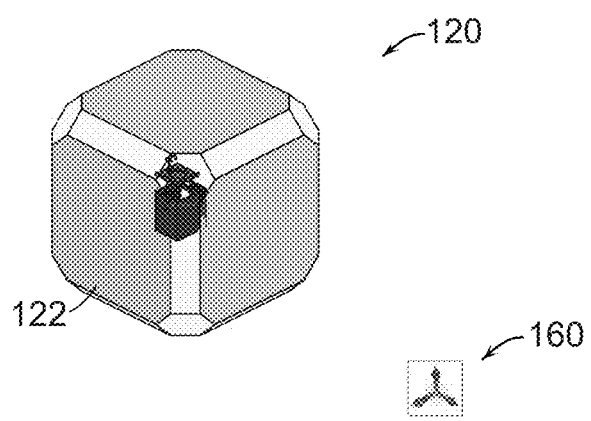
FIG. 6A-6C are schematic views of a GUI container element of an embodiment displayed with a scale for unit measured rotation (change in model orientation).
Figure 6B:
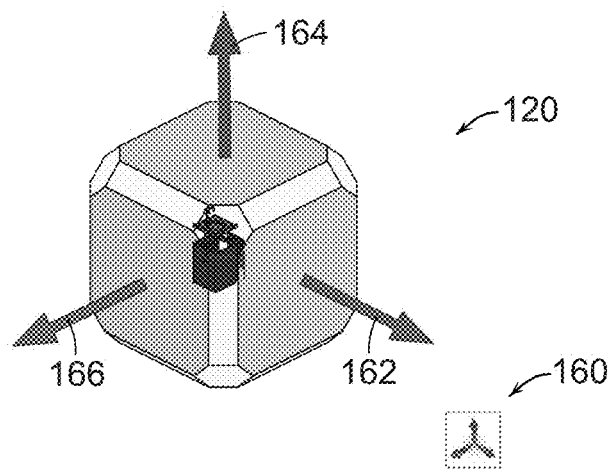
Figure 6C:
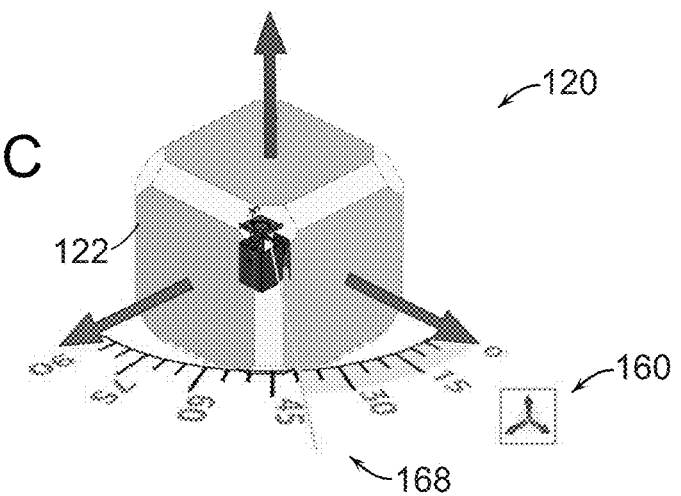

Alternatively, or in addition, step 320 displays a scale 168 in response to user command such as selection of button 160 and selection of an axis as previously detailed in FIGS. 6A through 6C. A follow-up user command may dismiss display of the scale 168 at step 319. Step 320 responds to user interaction with the displayed scale 168 by rotating in measured amounts in the associated axis direction container element 122 and thus 3D model 110 in work area 112. In embodiments, step 320 utilizes pertinent code or processor routine(s) of the system triad 117 to support rotation/change in orientation of 3D model 110 in work area 112 (minus any changes to current zoom level of display), and to support display and user-interactive operation of scale 168. In this way, step 320/CAD system 100 user selectively rotates (changes orientation of) 3D model 110 in work area 112 at the current zoom level as if the user was directly interacting with the model there.

Throughout user interaction effecting change in orientation of the 3D model 110 in work area 112, step 321 of operation 300 maintains current zoom level of the display view of model 110 and avoids requiring performance of 'zoom to extents.' This is accomplished by CAD system 100/operation 300 utilizing the coordinate system origin and axes definitions and parameters stored in system level data structure 94 (FIG. 5) and shared between system triad 117 and container triad 120 (as initialized at step 310). In embodiments, the rotation of container triad 120 is relative to the coordinate system origin. CAD system 100/step 321 maps or otherwise relates user interactive change in orientation of container triad 120 to orientation of 3D model 110 in work area 112, and thereby changes orientation of 3D model 110 while omitting the need for an associated 'zoom to extents' of the model.

After user rotation of the container element 122 has momentarily ceased, step 322 obtains a snapshot image of the 3D model 110 in the resulting orientation in the work area 112. Step 322 utilizes the snapshot image to form the miniaturized model depiction 124 by resizing the snapshot image to fit within the container element 122 as displayed and regenerates the container triad 120 in manipulation mode. Step 322 may be repeated at a frequency that enables container element 122 to illustrate (via the miniaturized model depiction formed from the snapshot image) real-time orientation of 3D model 110 in work area 112.

After user interaction with (rotation of) container element 122 ceases, step 323 displays the updated container triad 120 (of step 322) and the 3D model 110 as newly oriented by user selection with zoom level maintained of the display of work area 112. In turn, operation 300/CAD system 100 returns the container triad 120 to indicator mode at step 312. The xyz axes of container triad 120 in indicator mode provide an indication of current orientation of 3D model 110 in work area 112. Thereafter CAD system 100/operation 300 monitors for further I/O events or commands by the user.

In embodiments, there may be more than one way in addition to operation 300 for the user to effect change in model 110 orientation in the work area 112. So in alternatives to operation 300, a user changes 3D model 110 orientation in work area 112. In response, the container triad 120 indicates current model 110 orientation in triad indicator mode as well as manipulation mode as described above.

Figure 4:
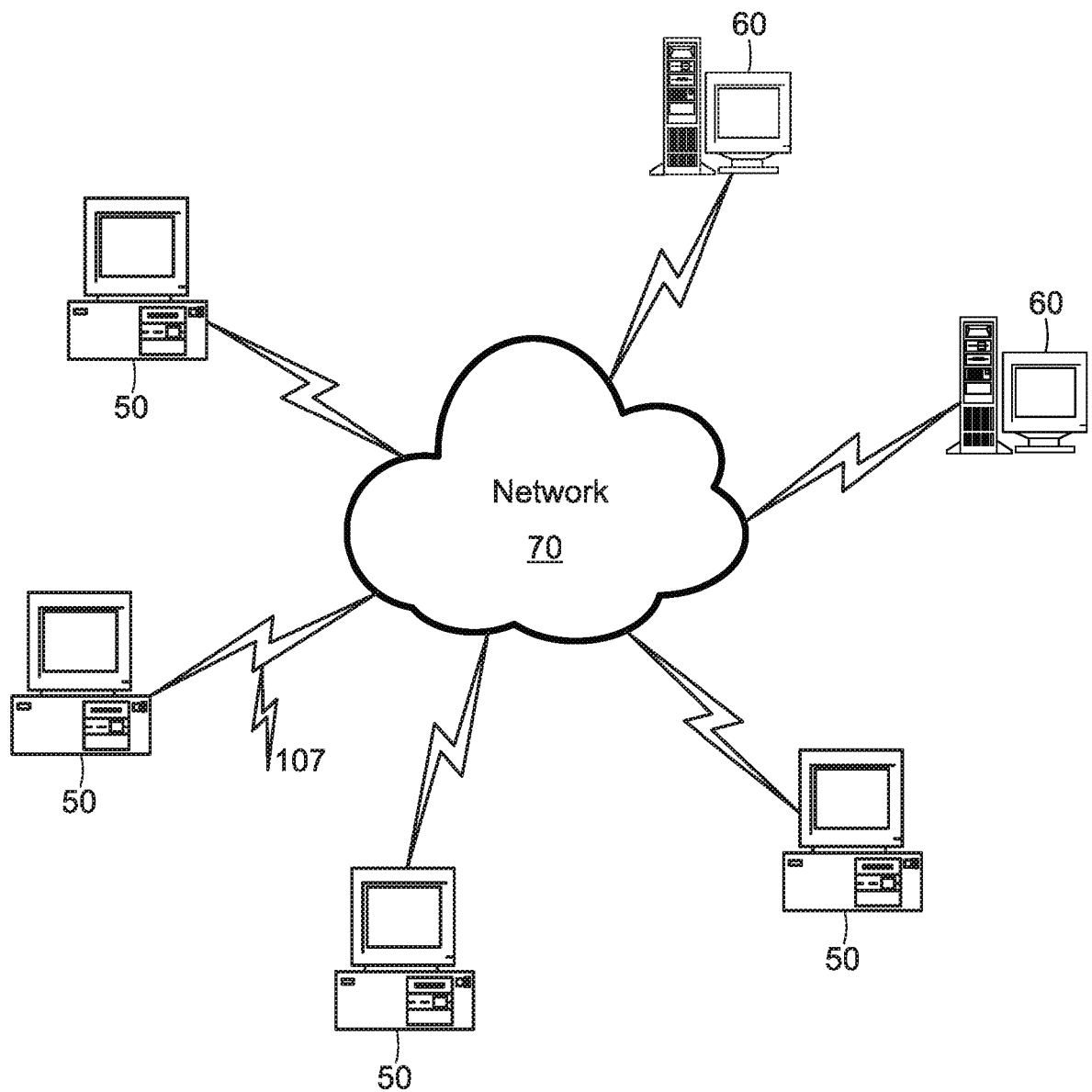
FIG. 4 is a computer network environment in which embodiments may be deployed.

FIG. 4 illustrates a computer network or similar digital processing environment in which the present invention may be implemented.

Client computer(s)/devices 50 and server computer(s) 60 provide processing, storage, and input/output devices executing application programs and the like. Client computer(s)/devices 50 can also be linked through communications network 70 to other computing devices, including other client devices/processes 50 and server computer(s) 60. Communications network 70 can be part of a remote access network, a global network (e.g., the Internet), cloud computing servers or service, a worldwide collection of computers, Local area or Wide area networks, and gateways that currently use respective protocols (TCP/IP, Bluetooth, etc.) to communicate with one another. Other electronic device/computer network architectures are suitable.

Figure 5:
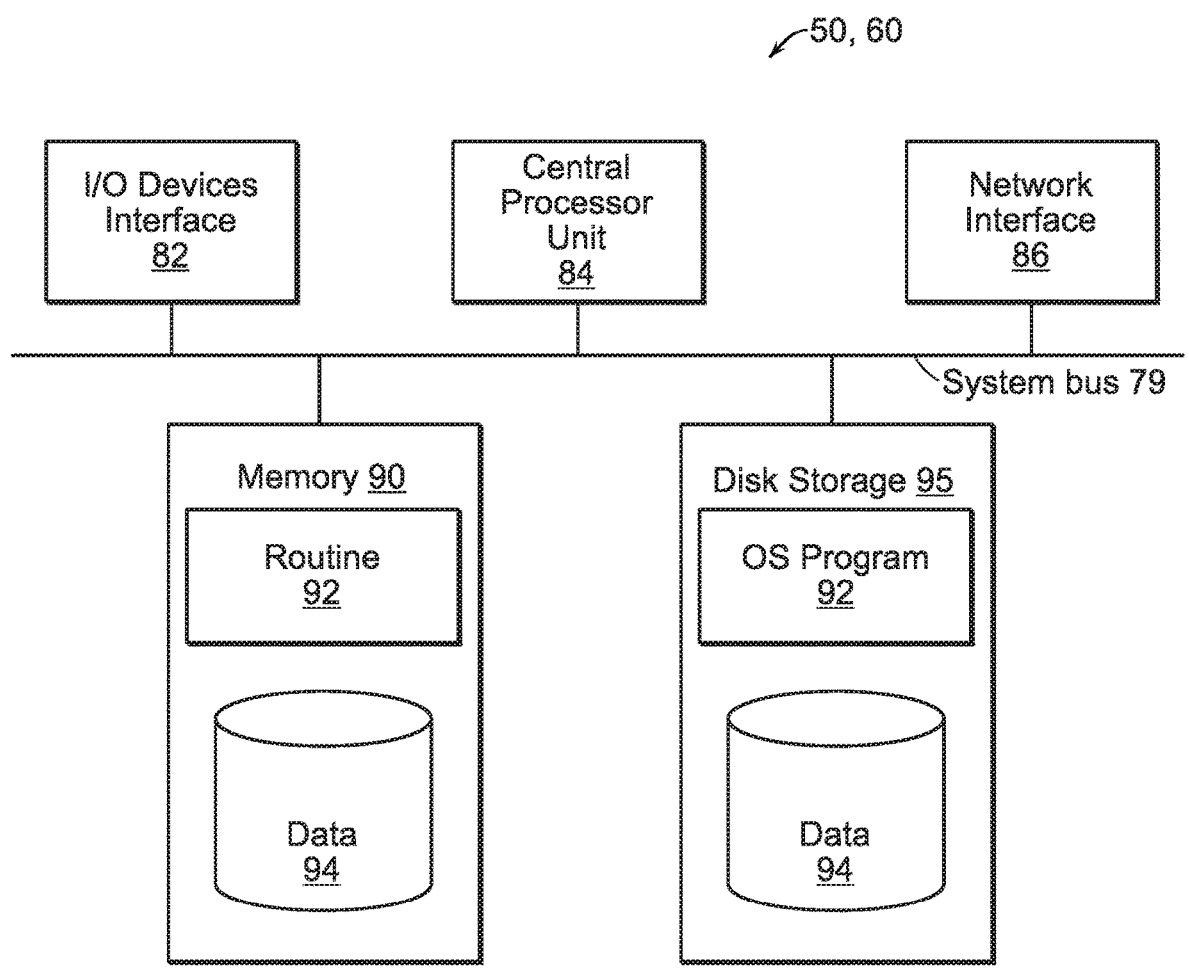
FIG. 5 is a computer node in the network of FIG. 4.

FIG. 5 is a diagram of the internal structure of a computer (e.g., client processor/device 50 or server computers 60) in the computer system of FIG. 4. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, touch screens, printers, speakers, etc.) to the computer 50, 60. Network interface 86 allows the computer to connect to various other devices attached to a network (e.g., network 70 of FIG. 4). Memory 90 provides volatile storage for computer software instructions 92 and data 94 used to implement an embodiment of the present invention (e.g., container triad 120—presentation and modes of operation thereof, change in model orientation operation 300, CAD system 100 modules/data structures, and supporting user interface (GUI) code of FIGS. 1A-1E, FIG. 2, and FIGS. 6A-6C detailed above). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network (s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

In other embodiments, the program product 92 may be implemented as a so-called Software as a Service (SaaS), or other installation or communication supporting end-users.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A system for providing a graphical user interface to a computer-generated 3D model, the system comprising:
    a computer processor; and
    a memory with computer code instructions stored thereon, the computer processor and the memory, with the computer code instructions, being configured to cause the system to provide a graphical user interface including:
        a first depiction of a 3D model, the first depiction being a miniaturized depiction of the 3D model rendered in the graphical user interface;
        a second depiction of the 3D model (i) being separately displayed from the miniaturized depiction in a work area in the graphical user interface, and (ii) being rendered in the work area based on user input and manipulation including based on a zoom level as selected and controlled by a user, the zoom level resulting in less than a full extent of the 3D model in the second depiction displayed in the work area;
        a container element encapsulating the miniaturized depiction, the container element having transparent sides such that the encapsulated miniaturized depiction is viewable through the sides of the container element and the miniaturized depiction illustrates a current orientation of the 3D model in the second depiction in the work area, and the container element being user interactive to effect orientation of the 3D model as displayed in the work area by the computer processor;
        in response to user interaction changing orientation of the container element, the computer processor similarly changing orientation of the 3D model in the second depiction in the work area while maintaining the user selected and controlled zoom level that results in less than the full extent of the 3D model in the second depiction displayed in the work area, said maintaining zoom level being by accessing a coordinate system origin definition and axes definition stored in a system level data structure, the coordinate system origin definition and axes definition shared for rendering both the first depiction and the second depiction, said accessing being instead of performing zoom to extents to determine the coordinate system origin definition and axes definition.

2. A system for providing a graphical user interface as claimed in claim 1 wherein the computer processor responsively changes orientation of the 3D model in the work area in a same direction and extent as the user interaction changes orientation of the container element.

3. A system for providing a graphical user interface as claimed in claim 1 wherein the user interaction rotates the container element in a certain direction with respect to a coordinate system, and the computer processor rotates the 3D model in the work area in a same direction as the certain direction of the container element.

4. A system for providing a graphical user interface as claimed in claim 3 wherein the container element has indicia of axes of the coordinate system.

5. A system for providing a graphical user interface as claimed in claim 4 wherein the coordinate system is a Cartesian coordinate system; and
    the indicia includes: a first side of the container element shaded red to indicate the x-axis, a second side of the container element shaded green to indicate the y-axis, and a third side of the container element shaded blue to indicate the z-axis.

6. A system for providing a graphical user interface as claimed in claim 4 wherein the indicia includes a triad.

7. A system for providing a graphical user interface as claimed in claim 3 wherein the user interaction rotates the container element according to measured units.

8. A system for providing a graphical user interface as claimed in claim 1 wherein the container element has a shape based on a cube, a sphere, or a volumetric space.

9. A system for providing a graphical user interface as claimed in claim 1 wherein the 3D model is a CAD system model, a computer-aided engineering (CAE) system model, or other computer based system model.

10. A computer implemented method comprising:
    rendering on a display a first depiction of a computer-generated 3D model in a work area based on user input and manipulation including based on a zoom level as selected and controlled by a user, the zoom level resulting in less than a full extent of the 3D model in the first depiction displayed in the work area;
    providing a graphical user interface (GUI) to the displayed 3D model, the GUI being formed of:
        (i) a second depiction of the 3D model, the second depiction being a miniaturized depiction of the 3D model rendered in the GUI and displayed separately from the 3D model displayed in the work area; and
        (ii) a container element encapsulating the miniaturized depiction, the container element having transparent sides such that the encapsulated miniaturized depiction is viewable through the sides of the container element and the miniaturized depiction illustrates a current orientation of the 3D model in the first depiction in the work area, and the container element being user interactive to effect orientation of the 3D model as displayed in the work area; and
    in response to user interaction changing orientation of the container element, similarly changing orientation of the 3D model in the first depiction in the work area while maintaining the user selected and controlled zoom level that results in less than the full extent of the 3D model in the first depiction displayed in the work area, said maintaining zoom level being by accessing a coordinate system origin definition and axes definition stored in a system level data structure, the coordinate system origin definition and axes definition shared for rendering both the first depiction and the second depiction, said accessing being instead of performing zoom to extents to determine the coordinate system origin definition and axes definition,
    said steps of rendering, providing, and similarly changing being performed by one or more computer processors.

11. The method as claimed in claim 10 wherein the similarly changing includes, at the zoom level, automatically changing orientation of the 3D model in the work area in a same direction and extent as the user interaction changes orientation of the container element.

12. The method as claimed in claim 10 wherein the user interaction rotates the container element in a certain direction with respect to a coordinate system, and the similarly changing includes at the zoom level automatically rotating the 3D model in the work area in a same direction as the certain direction of the container element.

13. The method as claimed in claim 12 wherein the container element has indicia of axes of the coordinate system.

14. The method as claimed in claim 13 wherein the coordinate system is a Cartesian coordinate system; and
the indicia includes: a first side of the container element shaded red to indicate the x-axis, a second side of the container element shaded green to indicate the y-axis, and a third side of the container element shaded blue to indicate the z-axis.

15. The method as claimed in claim 13 wherein the indicia includes a triad.

16. The method as claimed in claim 12 wherein the user interaction rotates the container element according to measured units.

17. The method as claimed in claim 10 wherein the container element has a shape based on a cube, a sphere, or a volumetric space.

18. The method as claimed in claim 10 wherein the rendering includes using a computer aided design (CAD) system to generate and render the 3D model in the work area.

19. A computer aided design system compromising:
a digital processor;
a memory communicatively coupled to the processor, the memory storing a 3D model in a manner enabling the processor to support rendering display of a first depiction of the 3D model in a work area based on user input including based on a zoom level as selected and controlled by a user, the zoom level resulting in less than a full extent of the 3D model in the displayed first depiction of the 3D model in the work area; and
a graphical user interface (GUI) tool enabling user-selective change in orientation of the displayed first depiction of the 3D model in the work area, the GUI tool formed of:
(i) a second depiction of the 3D model, the second depiction being a miniaturized depiction of the 3D model rendered outside the work area and displayed separately from the 3D model displayed in the work area, and
(ii) a container element encapsulating the miniaturized depiction, the container element having transparent sides such that the encapsulated miniaturized depiction is viewable through the sides of the container element and the miniaturized depiction illustrates a current orientation of the 3D model in the first depiction in the work area, and the container element being user interactive to effect orientation of the 3D model as displayed in the work area;

wherein the processor, in response to user interaction changing orientation of the container element, equivalently changes orientation of the 3D model in the first depiction in the work area while maintaining the user selected and controlled zoom level that results in less than the full extent of the 3D model in the displayed first depiction of the 3D model in the work area, said maintaining zoom level being by accessing a coordinate system origin definition and axes definition stored in a system level data structure, the coordinate system origin definition and axes definition shared for rendering both the first depiction and the second depiction, said accessing being instead of performing zoom to extents to determine the coordinate system origin definition and axes definition.

20. A computer program product comprising:
a non-transitory computer-readable medium carrying instructions embodying computer aided design (CAD) modeling, the instructions implementing processor display of a first depiction of a 3D model in a work area based on user input, the user input including a zoom level as selected and controlled by a user, the zoom level resulting in less than a full extent of the 3D model in the first depiction displayed in the work area;
the instructions including instructions that when executed by a computer cause the computer to:
provide a graphical user interface (GUI) to the displayed 3D model, the GUI being formed of:
(i) a second depiction of the 3D model, the second depiction being a miniaturized depiction of the 3D model rendered in the GUI and displayed separately from the 3D model displayed in the work area; and
(ii) a container element encapsulating the miniaturized depiction, the container element having transparent sides such that the encapsulated miniaturized depiction is viewable through the sides of the container element and the miniaturized depiction illustrates a current orientation of the 3D model in the first depiction in the work area, and the container element being user interactive to effect orientation of the 3D model as displayed in the work area; and
in response to user interaction changing orientation of the container element, similarly change orientation of the 3D model in the first depiction in the work area while maintaining the user selected and controlled zoom level that results in less than the full extent of the 3D model in the first depiction displayed in the work area, said maintaining zoom level being by accessing a coordinate system origin definition and axes definition stored in a system level data structure, the coordinate system origin definition and axes definition shared for rendering both the first depiction and the second depiction, said accessing being instead of performing zoom to extents to determine the coordinate system origin definition and axes definition.

* * * * *